(12) United States Patent
Bothra

(10) Patent No.: US 6,717,232 B2
(45) Date of Patent: Apr. 6, 2004

(54) SEMICONDUCTOR INDUCTOR AND METHODS FOR MAKING THE SAME

(75) Inventor: Subhas Bothra, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/406,914

(22) Filed: Apr. 2, 2003

(65) Prior Publication Data

US 2003/0170989 A1 Sep. 11, 2003

Related U.S. Application Data

(62) Division of application No. 09/614,393, filed on Jul. 12, 2000, now Pat. No. 6,573,148.

(51) Int. Cl.[7] .............................................. H01L 29/00
(52) U.S. Cl. ...................... 257/531; 257/758; 257/528; 438/197; 438/301; 438/381; 438/689
(58) Field of Search ................... 257/531, 758, 257/528; 438/381, 689, 197, 301

(56) References Cited

U.S. PATENT DOCUMENTS 5,446,311 A * 8/1995 Ewen et al. ................ 257/531
5,904,565 A * 5/1999 Nguyen et al. ............. 438/687
6,489,656 B1 * 12/2002 Lin .......................... 257/359
6,489,663 B2 * 12/2002 Ballantine et al. .......... 257/531
6,639,298 B2 * 10/2003 Chaudhry et al. .......... 257/531

* cited by examiner

Primary Examiner—Nathan Flynn
Assistant Examiner—Remmon R. Fordé
(74) Attorney, Agent, or Firm—Peter Zawilski

(57) ABSTRACT

A semiconductor inductor and a method for making a semiconductor inductor are provided. An oxide layer disposed over a substrate is etched to form an interconnect metallization trench within the oxide layer. The oxide layer is also etched to form a first inductor trench within the oxide layer such that the first inductor trench is defined in an inductor geometry. The oxide layer is then etched to form at least one via in the interconnect metallization trench and a second inductor trench over the first inductor trench in the oxide layer. The second inductor trench also has the inductor geometry. After the oxide layer is etched, the at least one via, the second inductor trench, the interconnect metallization trench and the first inductor trench are filled with copper. The semiconductor inductor is configured to have a low resistance and a high quality factor.

5 Claims, 12 Drawing Sheets

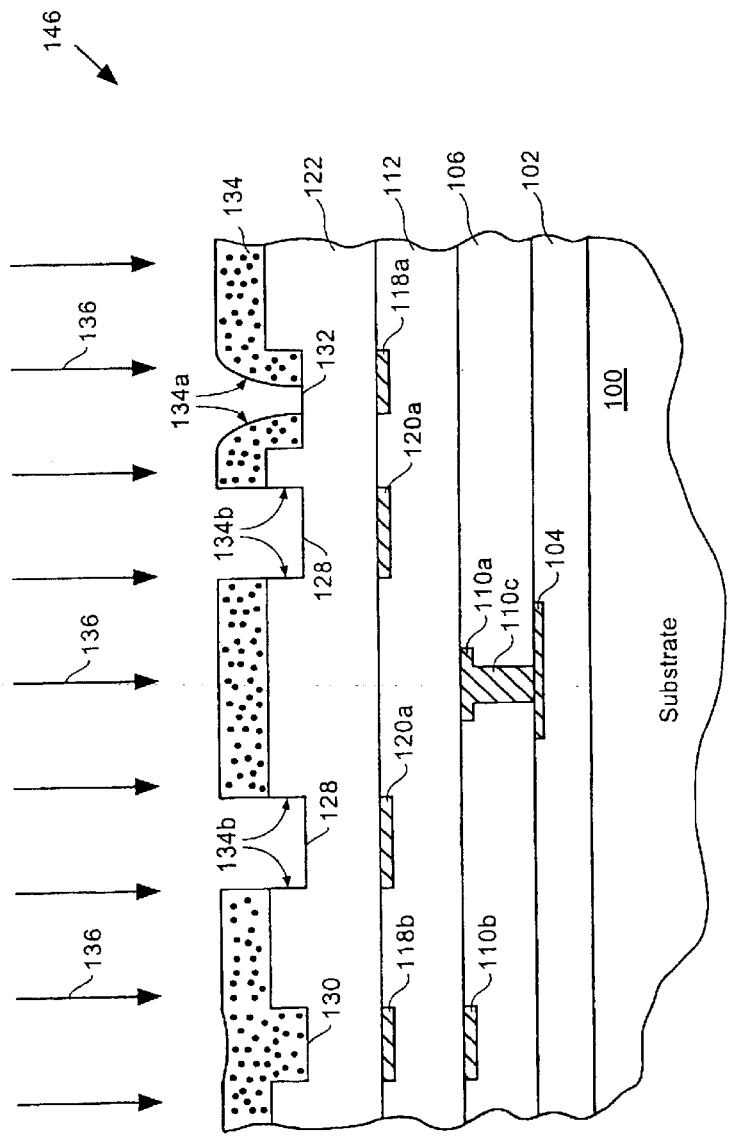

SEMICONDUCTOR INDUCTOR AND METHODS FOR MAKING THE SAME

This is a division of 09/614,393 filed Jul. 12, 2000 now U.S. Pat. No. 6,573,148.

BACKGROUND OF THE INVENTION

1. Field of the Invention

The present invention relates to inductors within devices of semiconductor chips, and more particularly, to the formation of inductors within a semiconductor device.

2. Description of the Related Art

Today's semiconductor devices are continually being pushed to meet stricter demands. As devices using this technology inundate the marketplace, consumers place higher demands on them. These demands include smaller, more compact devices with greater functionality. The growing market of wireless communications requires that smaller integrated circuits have greater functionality.

In order to meet these demands, RF integrated circuits must be more efficient in addition to being decreased in size along with the decreased size of components contained on the circuits. Due to the interest in RF circuitry, there is a greater push to design inductors as a passive element within a semiconductor device. An inductor is typically constructed in a semiconductor substrate using metallization lines formed in the shape of a spiral. The spiral shape of the inductor allows the structure to produce an inductance. Prior art inductors typically used aluminum (Al) for the metallization layers which form the spirals of the inductor.

One measure of efficiency of an inductor is its quality factor. The higher the quality factor, the greater the efficiency of the inductor. Thus, an inductor having a high quality factor is preferred. The quality factor of an integrated circuit is limited by parasitic losses within the substrate itself. These losses include high resistance through metal layers of the inductor itself. Consequently, in order to achieve a high quality factor, resistance within the inductor should be held to a minimum. One technique used to minimize the resistance within the inductor is increasing the thickness of metal used to fabricate the inductor. In order to accomplish this, prior art inductors are placed at the top level of the semiconductor substrate where metallization layers are thicker and where further planarization is not as critical. The inductor is also placed as far from the substrate as possible to reduce capacitance to substrate interactions with the substrate. Nevertheless, this configuration does not allow a high quality factor nor does it optimize the ability to reduce resistance.

As mentioned earlier, aluminum metallization layers were used to form spirals of prior art inductors. The use of aluminum minimized the ability to increase the thickness of the metal used to form the inductor, thereby increasing the resistance of an inductor. For example, individual aluminum layers were separated by layers of dielectric formed in the semiconductor wafer. In order to increase the thickness of metal used in an inductor, tungsten (W) interconnects were used in the layers of dielectric separating the aluminum layers. However, the use of tungsten to form an inductor is undesirable since tungsten has a high resistance which decreases the quality factor and the overall efficiency of an inductor using tungsten. In addition, tungsten interconnects generally had small via holes that do not greatly increase the thickness of metal used in an inductor having tungsten.

In view of the foregoing, there is a need for a method of making inductors in standard interconnect metallization structures. There is also a need for inductor structures that have a high quality factor. Additionally, there is a need for an inductor which can be fabricated without additional fabrication operations.

SUMMARY OF THE INVENTION

Broadly speaking, the present invention fills these needs by providing an inductor having a high quality factor and low resistance. It should be appreciated that the present invention can be implemented in numerous ways, including as a process, an apparatus, a system, a device, or a method. Several inventive embodiments of the present invention are described below.

In one embodiment, a method for making a semiconductor inductor is disclosed. An oxide layer disposed over a substrate is etched to form an interconnect metallization trench and a first inductor trench within the oxide layer. The first inductor trench is etched to define an inductor geometry. Next, at least one via is etched in the interconnect metallization trench and a second inductor trench is etched over the first inductor trench in the oxide layer. The second inductor trench also has the inductor geometry of the first inductor trench. The at least one via, the second inductor trench, the interconnect metallization trench and the first inductor trench are filled with a conductive material after the at least one via and the second inductor trench are etched in the oxide layer.

In another embodiment, a method for making a multi-level semiconductor inductor is disclosed. An oxide layer disposed over a substrate is etched to form an interconnect metallization trench and a first inductor trench within the oxide layer. The first inductor trench is etched such that an inductor geometry is defined within the oxide layer. The oxide layer is etched again to form at least one via in the interconnect metallization trench and a second inductor trench over the first inductor trench in the oxide layer. The second inductor trench is etched such that it also has the inductor geometry. After the at least one via and the second inductor trench are formed in the oxide layer, the at least one via, the second inductor trench, the interconnect metallization trench and the first inductor trench are filled with a copper material. The filled at least one via, second inductor trench, interconnect metallization trench and first inductor trench define a first inductive metallization structure.

The etch operations are performed on a next oxide layer disposed over the first inductive metallization structure to form another at least one via, another second inductor trench, another interconnect metallization trench and another first inductor trench. After the etch operation is completed, the at least one via, the second inductor trench, the interconnect metallization trench and the first inductor trench are filled with a copper material to define a second inductive metallization structure. The first and second metallization structures provide the multi-level semiconductor inductor with a reduced resistance and an increased quality factor.

In a further embodiment, a method for making a semiconductor inductor is disclosed. An inductor trench and a metallization trench are formed in an oxide layer such that the inductor trench defines an inductor geometry. A via trench and an additional inductor trench are then formed in the oxide layer such that the additional inductor trench also defines the inductor geometry. The via trench, the additional inductor trench, the inductor trench and the metallization trench are then filled with a metal whereby the filled additional inductor trench and the filled inductor trench define the semiconductor inductor, the filled metallization trench defines a metallization line and the filled via trench defines a conductive via.

In yet another embodiment of the present invention, an inductor structure is disclosed. The inductor structure includes a first oxide layer having a first thickness and a first metallization level disposed in a first part of the first oxide layer with the first metallization level having an inductor geometry. A second metallization level having the inductor geometry is disposed over the first metallization level in a second part of the first oxide layer. The first part of the first oxide layer and the second part of the first oxide layer define the first thickness of the first oxide layer. The inductor structure of the first metallization level and the second metallization level define a multi-level inductor structure having a low resistance characteristic and a high quality factor.

In another embodiment of the present invention, a semiconductor inductor is disclosed. The semiconductor inductor includes a first inductor structure which is of a copper material. The first inductor has an inductor geometry and the first inductor is defined to a partial depth within an oxide layer that is disposed over a substrate. A metallization line which is of the copper material is defined in the oxide layer to the same partial depth of the oxide layer. The semiconductor inductor also includes a conductive via of the same copper material defined in a remaining depth of the oxide layer relative to the partial depth such that the conductive via interconnects the metallization line to another feature. In addition, a second inductor structure of the same copper material and having the inductor geometry forms the semiconductor inductor. The second inductor structure is disposed in the remaining depth of the oxide layer.

The many advantages of the current invention should be recognized. The present invention allows for the formation of a semiconductor inductor using standard fabrication techniques which do not require additional fabrication steps. In addition, the inductor of the present invention can be fabricated to have low resistance and a high quality factor. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIG. 2D shows an oxide etch operation being performed on a semiconductor device to form inductor line trenches and via trenches according to one embodiment of the present invention.

DETAILED DESCRIPTION OF THE PREFERRED EMBODIMENTS

Figure 1:
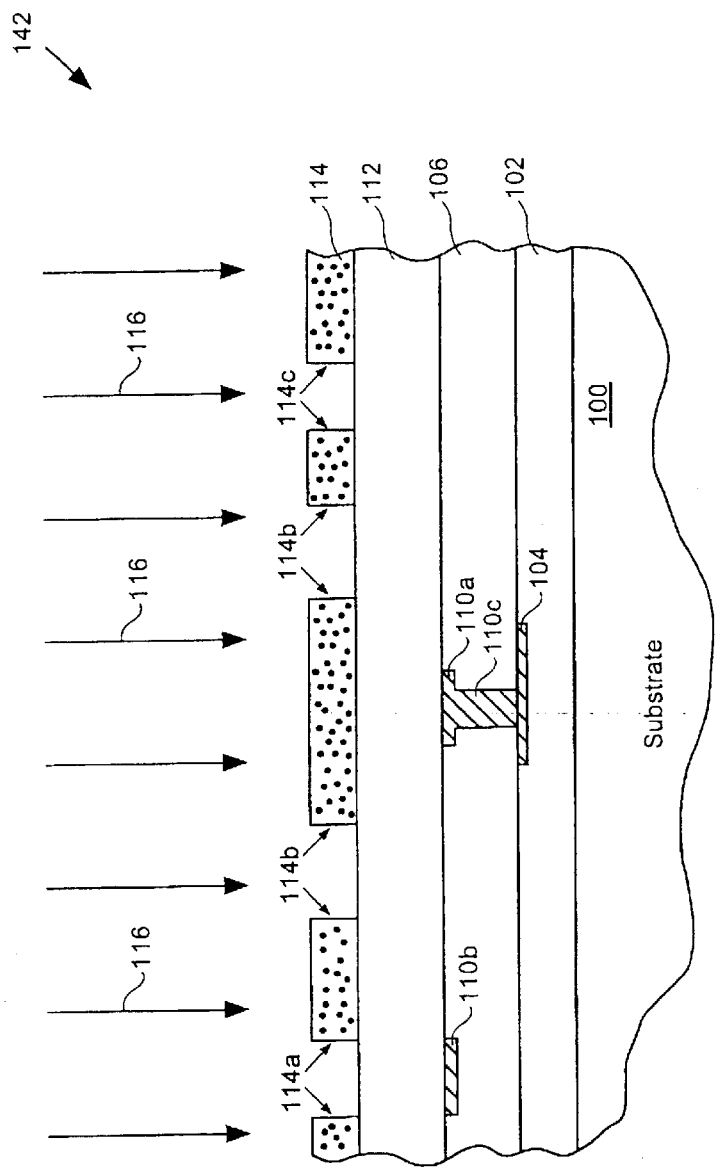
FIG. 1 shows an etch operation being performed to form trenches in a semiconductor structure in accordance with one embodiment of the present invention.

A semiconductor inductor and a method for making a semiconductor inductor is disclosed. In the following description, numerous specific details are set forth in order to provide a thorough understanding of the present invention. It will be understood, however, to those skilled in the art, that the present invention may be practiced without some or all of these specific details. In other instances, well known process operations have not been described in detail in order not to unnecessarily obscure the present invention.

The present invention uses damascene processes and dual damascene processes to form an inductor, metallization lines, and conductive vias within a semiconductor structure. The conductive vias interconnect the metallization lines with other metallization lines located throughout the semiconductor structure to form features within the semiconductor device. The metallization lines are formed by etching trenches into an oxide layer.

An oxide layer is deposited onto a semiconductor structure using techniques known in the art, for example, blanket deposition. A photoresist layer is then spin coated over the oxide layer and patterned using standard photolithography techniques. The patterned photoresist layer defines locations of metallization line trenches and trenches for other features (i.e., inductor geometries) to be etched into the oxide layer. After the patterned photoresist layer is formed over the oxide layer, the oxide layer is etched during an oxide etch operation to form the metallization line trenches and other feature trenches within the oxide layer. The trenches define the location of the aforementioned metallization lines and other features in the semiconductor structure. The oxide etch operation to form the trenches is commonly referred to as a "damascene" process.

Once the trenches are formed, a second photoresist layer is spin coated over the oxide layer and patterned using standard photolithography techniques. The second patterned photoresist layer defines locations of via trenches to be etched into the oxide layer. After the second patterned photoresist layer is formed over the oxide layer, the oxide layer is again etched during an oxide etch operation to form the via trenches within the oxide layer. The trenches define the location of the aforementioned conductive vias in the semiconductor structure. The oxide etch operation etches through selected areas of the defined trenches formed in the initial oxide etch operation in order to allow electrical communication between the metallization line to be formed in the metallization line trench and the conductive via to be formed in the via trench. The oxide etch operation to form the via trenches is commonly referred to as a "dual damascene" process because the oxide operation etches through the metallization line trenches formed with the damascene process.

After the trenches are formed in the oxide layer, a metal is deposited into the trenches to form the metallization lines and the conductive vias. The metal typically deposited in trenches formed using a damascene process is copper (Cu). Copper has low resistance, of about $2\times10^{-6}$ ohm-cm, therefore copper is preferable for applications requiring low resistance in metallization lines and conductive vias. Once the metal is deposited into the metallization line trenches and the via trenches, a planarization operation, such as chemical mechanical polishing (CMP), is performed to make a top surface of the metallization lines and other features even with a top surface of the oxide layer.

Making reference to FIG. 1, an etch operation to form trenches in a semiconductor structure is shown in accordance with one embodiment of the present invention. A semiconductor structure 146 contains oxide layers 102, 106 and 112 formed in accordance with the process previously mentioned. In addition, metallization lines 104, 110a and 110b and a via 110c are formed within the semiconductor structure 146 using the damascene and dual damascene processes defined above. The metallization lines 104, 110a and 110b and the conductive via 110c are preferably made from copper (Cu). The via 110c allows electrical communication between the metallization line 104 and the metallization line 110a. The metallization lines 104, 110a and 110b interconnect with other metallization lines (not shown) and other features (not shown) located in the semiconductor structure 146.

After the metallization lines 104, 110a and 110b and the conductive via 110c are formed in the semiconductor structure 146, the oxide layer 112 is blanket deposited over the oxide layer 106 to allow the formation of a next metallization layer within the semiconductor structure 146. A photoresist layer is then spin coated over the oxide layer 112 and patterned using standard photolithography techniques to form patterned photoresist layer 114. The patterned photoresist layer 114 is patterned such that windows 114a, 114b and 114c are formed. The windows 114a and 114c define the pattern for metallization line trenches to be formed in the oxide layer 112 and the window 114b defines the pattern of an inductor trench, as will be shown with reference to FIG. 2A. It should also be noted that the pattern of the window 114b forms an inductor geometry in the shape of a spiral, as will be more clearly shown with reference to FIGS. 6A and 6B below. Referring back to FIG. 1, once the patterned photoresist layer 114 is formed, an oxide etch operation 116 is performed to etch the oxide layer 112 to form the metallization lines 118a and 118b and an inductor line 120a, as shown with respect to FIG. 2A.

Figure 2A:
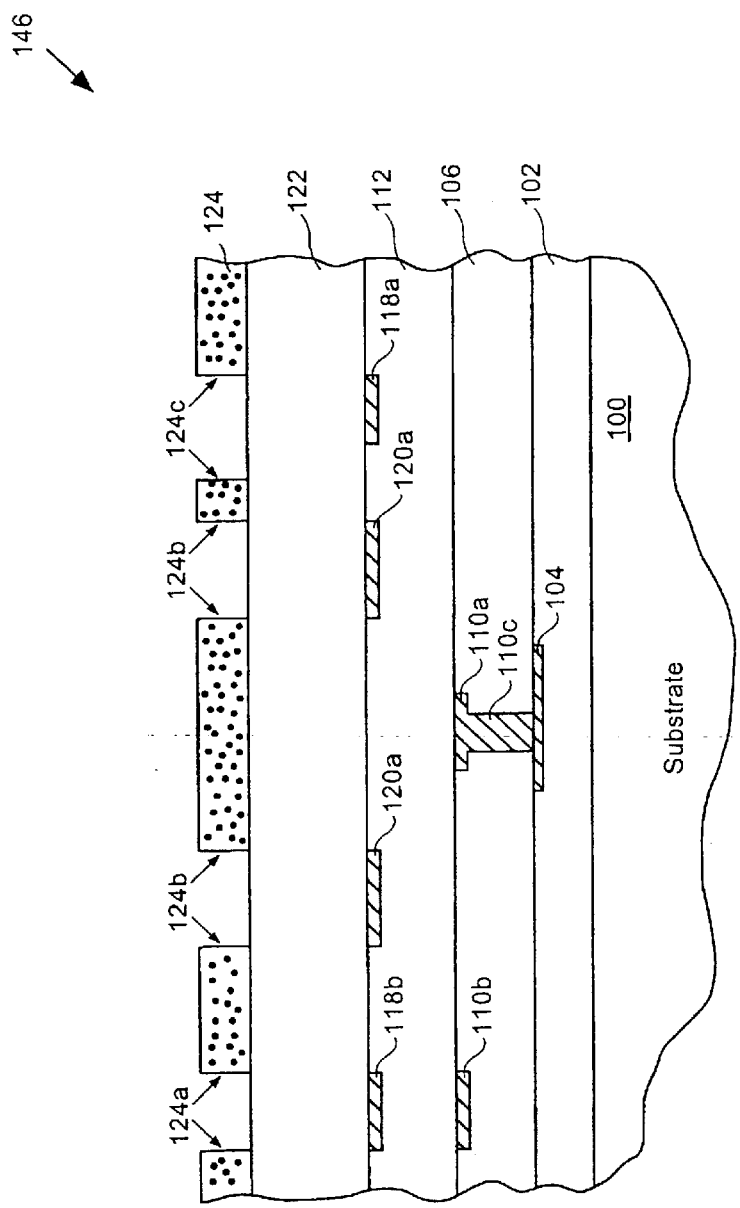
FIG. 2A illustrates the formation of metallization lines and the formation of an inductor line in accordance with one embodiment of the present invention.

FIG. 2A illustrates the formation of the metallization lines 118a and 118b and the formation of the inductor line 120a in accordance with one embodiment of the present invention. Trenches defining the metallization lines 118a and 118b were formed using the damascene process described above. After the oxide etch operation 116 is complete, the trenches defining the metallization lines 118a and 118b are deposited with a low resistance metal. The metallization lines 118a and 118b are preferably made of copper (Cu), having a low resistance of about $2.0\times10^{-6}$ ohms-cm. The metallization lines 118a and 118b are formed to a thickness in a range preferably between about 5000 Angstroms and about 10000 Angstroms, and more preferably about 8000 Angstroms. The metallization lines 118a and 118b interconnect with other metallization lines (not shown) and other features (not shown) located throughout the semiconductor device 146.

The inductor line 120a was also formed using the damascene process described above. The inductor line 120a defines a first level for an inductor 120 to be formed within the semiconductor structure 146. The inductor line 120a is also preferably made of copper (Cu). The inductor line 120a is formed to a thickness in a range preferably between about 5000 Angstroms and about 10000 Angstroms, and more preferably about 8000 Angstroms. After the metal is deposited into the trenches, a planarization operation, such as CMP, is performed to even out top surfaces of the inductor line 120a and metallization lines 118a and 118b with a top surface of the oxide layer 112. Again, it should be noted that the inductor line 120a is in an inductor geometry which is in the shape of a spiral, as will be described in further detail with respect to FIGS. 6A and 6B. It should also be noted that as the inductor line 120a and the metallization lines 118a and 118b were formed, other metallization lines (not shown) and other features (not shown) were formed throughout the semiconductor structure 146. Making reference once again to FIG. 2A, after the metallization lines 118a and 118b and the inductor line 120a are formed, an oxide layer 122 is blanket deposited over the oxide layer 112. A photoresist layer is then spin coated over the oxide layer 122 and patterned using standard photolithography techniques to form the patterned photoresist mask 124.

The patterned photoresist mask 124 is patterned such that windows 124a, 124b and 124c are formed. The windows 124a and 124c define patterns for metallization line trenches that will be etched into the oxide layer 122. The window 124b defines a pattern for a first inductor trench to be formed in the oxide layer 122. The pattern defined by the window 124b forms an inductor geometry in the shape of a spiral which is the same as the pattern defined by the inductor line 120a. After the patterned photoresist mask 124 is formed over the oxide layer 122, an oxide etch operation 126 is performed, as shown with reference to FIG. 2B.

Figure 2B:
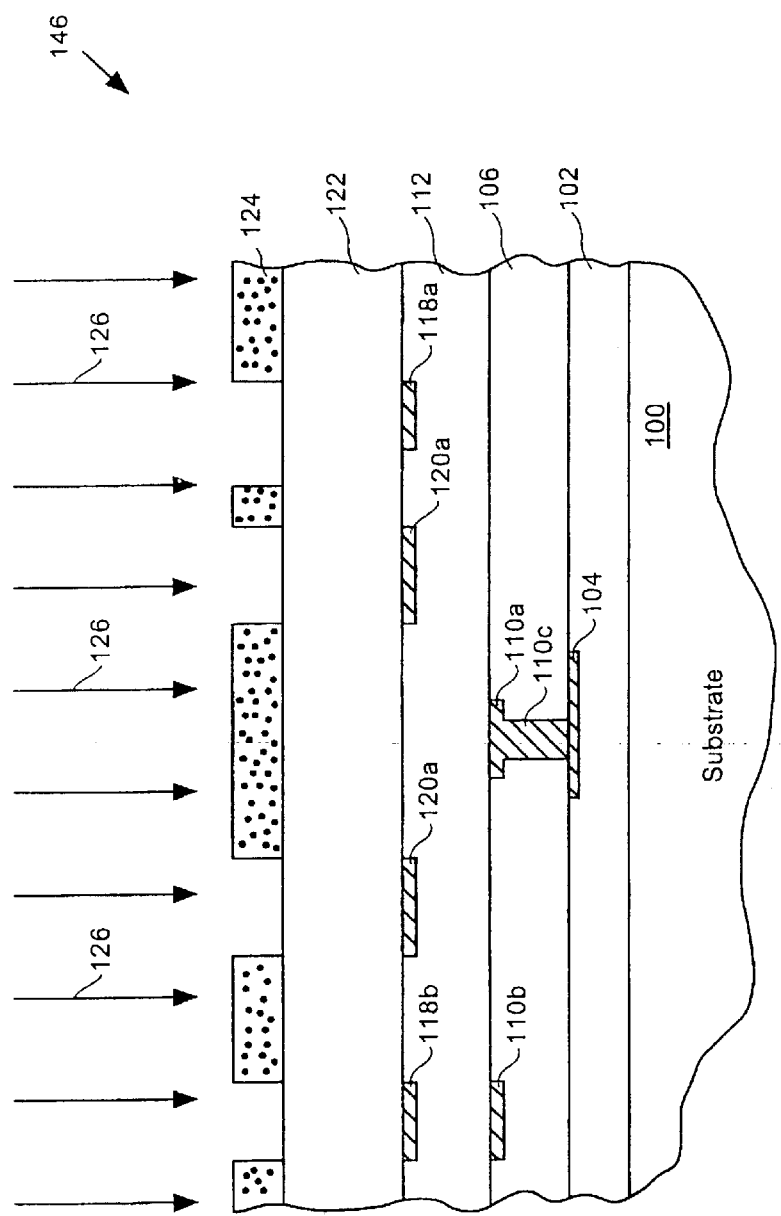
FIG. 2B shows an oxide etch operation being performed on a semiconductor structure in accordance with one embodiment of the present invention.

FIG. 2B shows the oxide etch operation 126 being performed on the semiconductor structure 146, in accordance with one embodiment of the present invention. The oxide etch operation 126 etches the oxide layer 122 such that a first inductor trench 128 and interconnect metallization trenches 130 and 132 are formed in the oxide layer 122, as shown with reference to FIG. 2C.

Figure 2C:
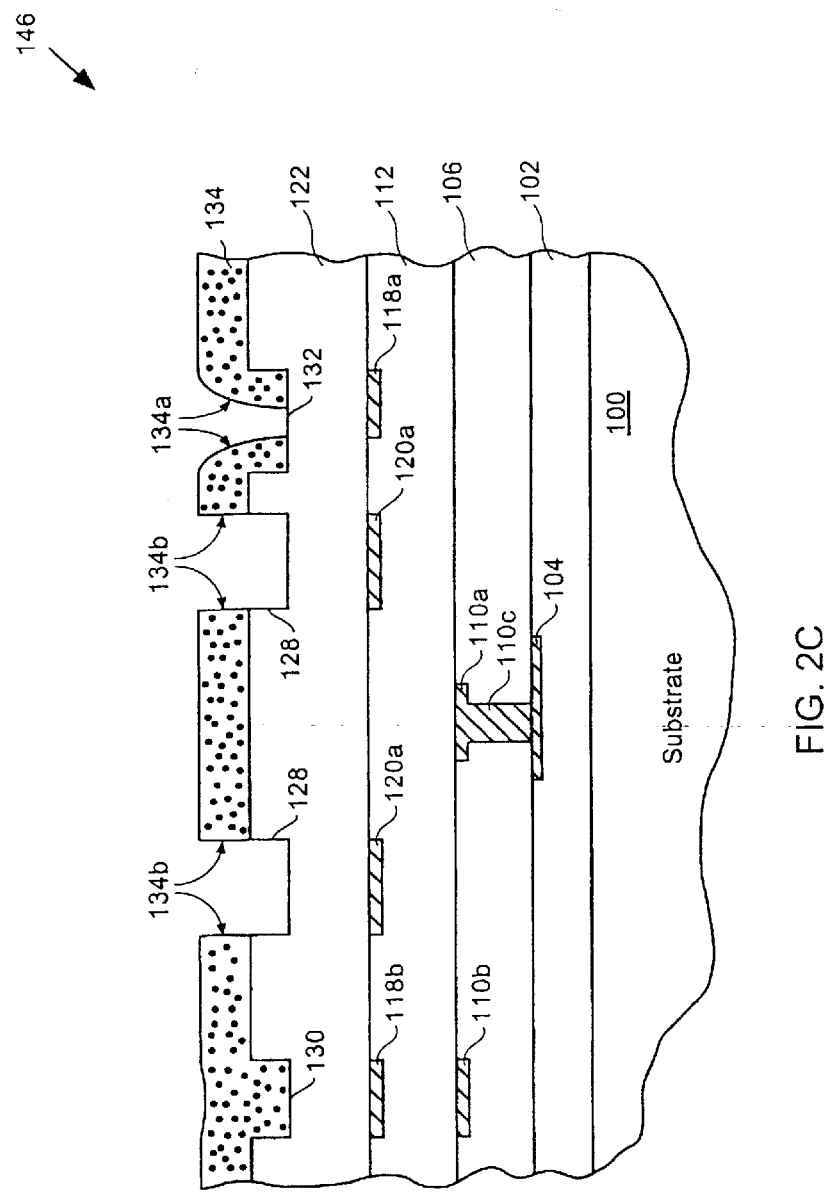
FIG. 2C illustrates the formation of a first inductor trench and metallization line trenches in accordance with one embodiment of the present invention.

FIG. 2C illustrates the formation of the first inductor trench 128 and metallization line trenches 130 and 132 in accordance with one embodiment of the present invention. The trenches 128, 130 and 132 are formed in the oxide layer 122 using the previously described damascene processes. The metallization line trenches 130 and 132 allow for the formation of metallization lines in the oxide layer 122, as will be shown with reference to FIG. 2E. The first inductor trench 128 allows the formation of an inductor line 120b-1, as will be shown with reference to FIG. 2E. Again, it should be noted that as the metallization line trenches 130 and 132 and the first inductor trench 128 are formed, other trenches defining metallization lines (not shown) and other features (not shown) are formed within the semiconductor structure 146. Referring back to FIG. 2C, after the trenches 128, 130 and 132 are formed, a second photoresist layer is spin coated onto the oxide layer 122 and patterned using standard photolithography techniques to form the patterned photoresist mask 134.

The patterned photoresist mask 134 contains windows 134*a* and 134*b*. The window 134*a* defines a pattern for a via trench (not shown) to be formed beneath the metallization line trench 132 and the window 134*b* defines the pattern for a second inductor trench 129 (as shown with respect to FIG. 5). After the patterned photoresist mask 134 is formed over the oxide layer 122, an oxide etch operation 136 is performed, as shown with reference to FIG. 2D.

FIG. 2D shows the oxide etch operation 136 being performed on the semiconductor device 146 according to one embodiment of the present invention. The oxide etch operation 136 etches the oxide layer 122 to form the via trench (not shown) and the second inductor trench 129 using a dual damascene process as described above. Once the oxide etch operation 136 is complete, metal is deposited into the via, the second inductor trench 129, the metallization line trenches 130 and 132 and the first inductor trench 128. The deposition operation (not shown) forms a conductive via 108*c*, the inductor line 120*b*-2, metallization lines 108*a* and 108*b* and an inductor line 120*b*-1, as shown with reference to FIG. 2E.

Figure 2E:
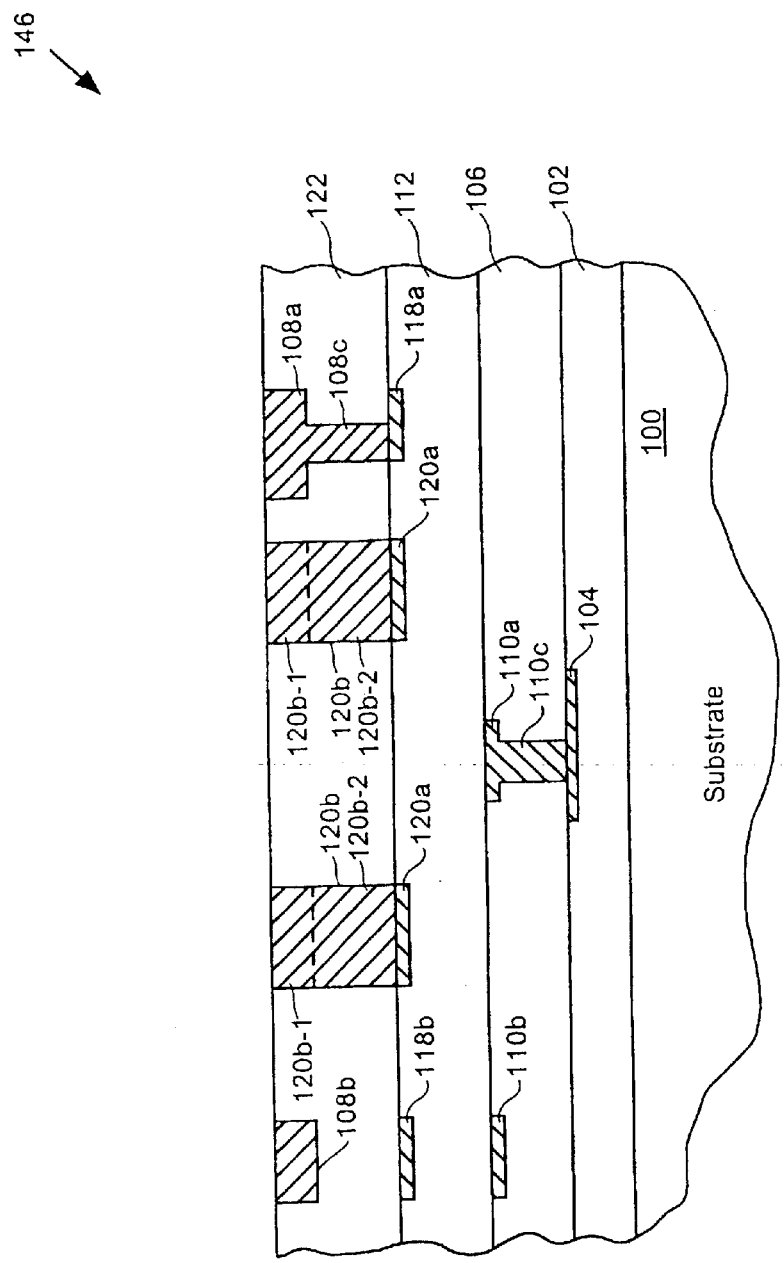
FIG. 2E shows a semiconductor structure with formed metallization lines and a formed inductor line in accordance with one embodiment of the present invention.

FIG. 2E shows the semiconductor structure 146 with formed metallization lines 108*a* and 108*b* and formed inductor line 120*b*, in accordance with one embodiment of the present invention. As mentioned above, the metal deposited into the trenches is preferably copper (Cu). The inductor line 120*b*-1 and the metallization lines 108*a* and 108*b* are formed to a thickness in the range preferably between about 5000 Angstroms and about 50000 Angstroms, more preferably about 10000 Angstroms and about 30000 Angstroms and most preferably about 20000 Angstroms. The inductor line 120*b*-2 and the conductive via 108*c* are formed to a thickness and a depth in the range preferably between about 5000 Angstroms and about 20000 Angstroms, more preferably about 8000 Angstroms and about 15000 Angstroms and most preferably about 12000 Angstroms. After the metal is deposited into the trenches, a planarization operation, such as CMP, is performed to even out top surfaces of the inductor line 120*b* and metallization lines 108*a* and 108*b* with a top surface of the oxide layer 122.

Figure 3:
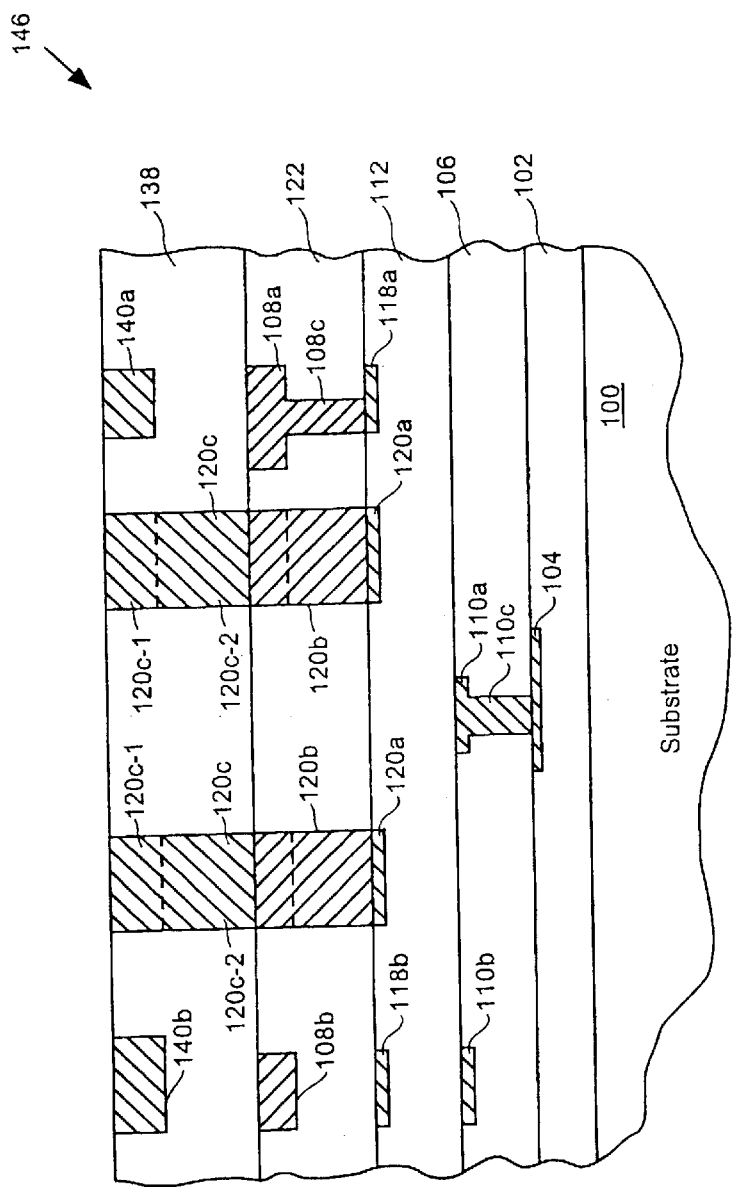
FIG. 3 shows the semiconductor structure with an inductor line and metallization lines formed in an oxide layer in accordance with one embodiment of the present invention.

FIG. 3 shows the semiconductor structure 146 with an inductor line 120*c* and metallization lines 140*a* and 140*b* formed in an oxide layer 138 in accordance with one embodiment of the present invention. A trench defining a pattern for an inductor line 120*c*-1 and trenches defining patterns for the metallization lines 140*a* and 140*b* are patterned into the oxide layer 138 using a damascene process described above. A trench defining a pattern for the inductor line 120*c*-2 is then patterned into the oxide layer 138 using a dual damascene process described above. After the trenches are patterned into the oxide layer 138, metal is deposited into the trenches to form the inductor lines 120*c*-1 and 120*c*-2 and the metallization lines 140*a* and 140*b*. The metal deposited into the trenches is preferably copper (Cu). The inductor line 120*c*-2 is formed to a thickness in the range between preferably about 5000 Angstroms and about 20000 Angstroms, and more preferably about 8000 Angstroms and about 15000 Angstroms and most preferably about 12000 Angstroms.

The inductor line 120*c*-1 and the metallization lines 140*a* and 140*b* are formed to a thickness in the range between preferably about 5000 Angstroms and about 50000 Angstroms, and more preferably about 10000 Angstroms and about 30000 Angstroms and most preferably about 20000 Angstroms. After the metal is deposited into the trenches, a planarization operation, such as CMP, is performed to even out top surfaces of the inductor line 120*c* and metallization lines 140*a* and 140*b* with a top surface of the oxide layer 138. It should be noted that as the inductor line 120*c* and the metallization lines 140*a* and 140*b* are formed in the semiconductor structure 146, additional metallization lines (not shown) and features (not shown) are formed in the semiconductor structure 146. Once the inductor line 120*c* and the metallization lines 140*a* and 140*b* are formed in the oxide layer 138, an inductor line 120*d*, metallization lines 142*a* and 142*b* and a conductive via 142*c* may be formed in an oxide layer 144, as shown with respect to FIG. 4.

Figure 4:
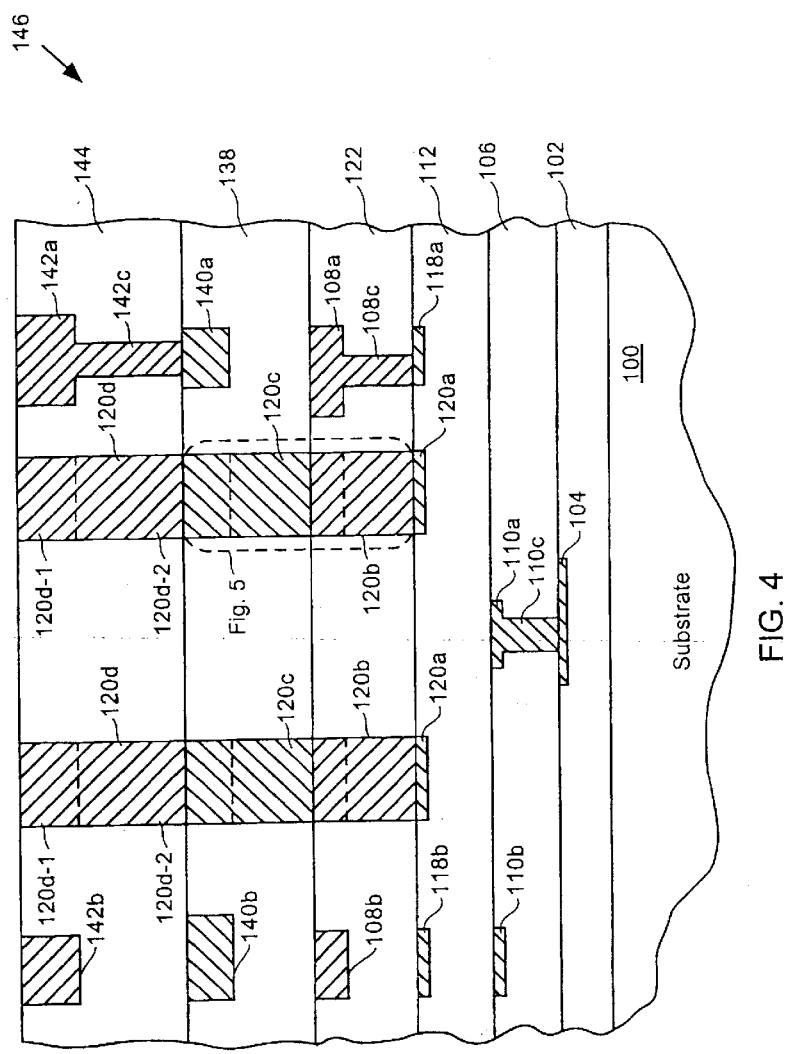
FIG. 4 shows an additional metallization layer in a semiconductor structure having an inductor line, metallization lines and a conductive via in an oxide layer in accordance with one embodiment of the present invention.

FIG. 4 shows an additional metallization layer in the semiconductor structure 146 having the inductor line 120*d*, the metallization lines 142*a* and 142*b* and the conductive via 142*c* in an oxide layer 144 in accordance with one embodiment of the present invention. The inductor line 120*d* is defined by inductor lines 120*d*-1 and 120*d*-2. A trench defining a pattern for the inductor line 120*d*-1 which defines a top portion of the inductor line 120*d* and trenches defining patterns for the metallization lines 142*a* and 142*b* are patterned into the oxide layer 144 using a damascene process described above. Then, a trench defining a pattern for the inductor line 120*d*-2 and a trench defining a pattern for the conductive via 142*c* is patterned into oxide layer 144 using a dual damascene technique described above. After the trenches are patterned into the oxide layer 144, metal is deposited into the trenches to form the inductor lines 120*d*-1 and 120*d*-2, the metallization lines 142*a* and 142*b* and the conductive via 142*c*. The metal deposited into the trenches is preferably copper (Cu). The inductor line 120*d*-2 and the conductive via 142*c* are formed to a thickness and a depth in a range between preferably about 5000 Angstroms and about 20000 Angstroms, and more preferably about 8000 Angstroms and about 15000 Angstroms and most preferably about 12000 Angstroms. The inductor line 120*d*-1 and the metallization lines 142*a* and 142*b* are formed to a thickness in the range between preferably about 5000 Angstroms and about 50000 Angstroms, and more preferably about 10000 Angstroms and about 30000 Angstroms and most preferably about 20000 Angstroms. Once the inductor line 120*d* and the metallization lines 142*a* and 142*b* are formed in the oxide layer 144, a CMP operation is performed to make a top surface of the inductor line 120*d* and a top surface of the metallization lines 142*a* and 142*b* even with a top surface of the oxide layer 144. Again, it should be noted that as the inductor line 120*d*, the metallization lines 142*a* and 142*b* and the conductive via 142*c* are formed, other metallization lines (not shown) and other features (not shown) are formed in the oxide layer 144. It should also be noted that other metallization layers containing additional inductor lines, metallization lines and other features may be formed for the semiconductor structure 146.

As is shown with reference to FIG. 4, as each inductor line is formed in the semiconductor structure 146 a further distance away from the substrate 100, the thickness of the inductor increases. This is advantageous in that as an increased amount of metal is used for the inductor 120, the resistance of the inductor decreases, thereby increasing the overall inductance and the quality factor of the inductor.

Figure 5:
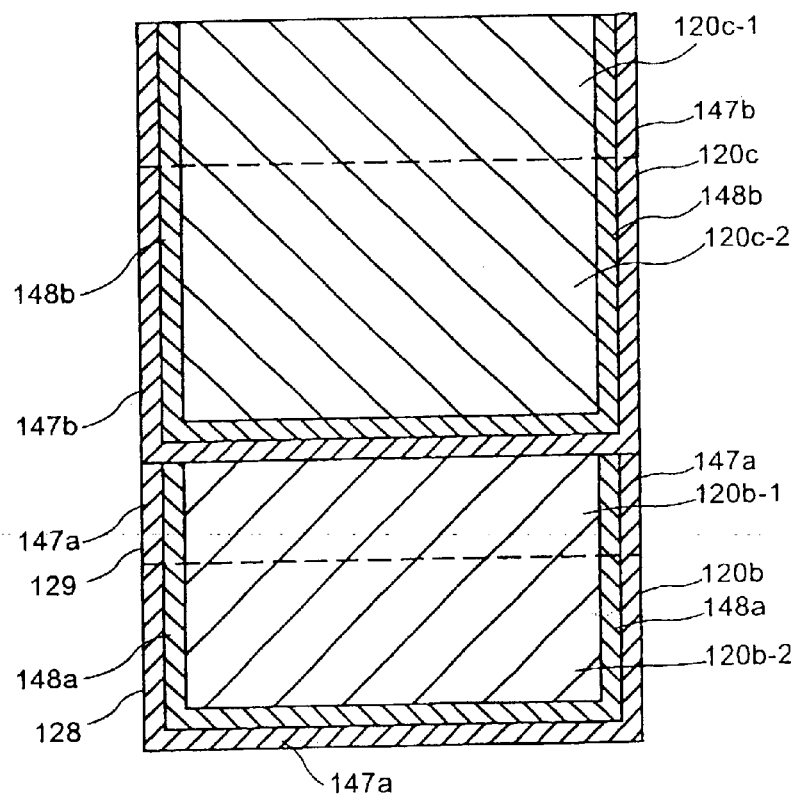
FIG. 5 shows inductor lines with barrier layers and seed layers in accordance with one embodiment of the present invention.

FIG. 5 shows the inductor line 120*b* and the inductor line 120*c* with barrier layers 147*a* and 147*b* and seed layers 148*a* and 148*b* in accordance with one embodiment of the present invention. The barrier layer 147*a* is designed to prevent the migration of metal in the inductor line 120b into the semiconductor structure 146. In one embodiment, after the second inductor trench 129 is etched into the oxide layer 122, the barrier layer 147a is formed in the first inductor trench 128 (see FIG. 2C) and the second inductor trench 129. The barrier layer 147a is deposited into the first inductor trench 128 and the second inductor trench 129 using any number of techniques known in the art, including physical vapor deposition (PVD) or the like. It should be noted that as the barrier layer 147a is formed in the first inductor trench 128 and the second inductor trench 129, other barrier layers (not shown) are also formed in the interconnect metallization trenches 130 and 132, the via trench and other trenches (not shown) formed in the oxide layer 122 during the oxide etch operation 136. In one embodiment, the barrier layer 147a is preferably tantalum (Ta) or preferably tantalum nitride (TaN). The barrier layer 147a preferably has a thickness in a range of about 50 Angstroms and about 1000 Angstroms, more preferably between about 100 Angstroms and about 300 Angstroms, and most preferably about 200 Angstroms.

After the barrier layer 147a is formed in the inductor line 120b, the seed layer 148a is formed over the barrier layer 147a. The seed layer 148a optimizes the adhesion of copper and thus the formation of the inductor line 120b. The formation of the seed layer 148a is commonly done using standard electroplating techniques, deposition techniques, or the like. The seed layer 148a is preferably copper (Cu). The seed layer 148a is preferably deposited to a thickness in a range between about 50 Angstroms and about 1000 Angstroms, and more preferably between about 200 Angstroms and about 500 Angstroms, and most preferably about 300 Angstroms. It should be noted that as the seed layer 148a is formed in the first inductor trench 128 and the second inductor trench 129, other seed layers (not shown) are simultaneously formed in the interconnect metallization trenches 130 and 132, the via trench and other trenches (not shown) formed in the oxide layer 122 during the oxide etch operation 136.

FIG. 5 also shows the formation of a barrier layer 147b and a seed layer 148b in accordance with one embodiment of the present invention. The barrier layer 147b is designed to prevent the migration of metal in the inductor line 120c into the semiconductor structure 146. In one embodiment, after the oxide layer 138 is etched to form a trench for the inductor line 120c, the barrier layer 147b is deposited into the trench. As with the barrier layer 147a, when the barrier layer 147b is formed in the trench for the inductor line 120c, barrier layers (not shown) for other metallization lines (not shown) and other features (not shown) are simultaneously formed in the other metallization lines and the other features in the oxide layer 138. The barrier layer 147b is deposited into the trench for the inductor line 120c using any number of techniques known in the art, including physical vapor deposition (PVD) or the like. In one embodiment, the barrier layer 147b is preferably tantalum (Ta) or preferably tantalum nitride (TaN). The barrier layer 147b preferably has a thickness in a range of about 50 Angstroms and about 1000 Angstroms, more preferably between about 100 Angstroms and about 300 Angstroms, and most preferably about 200 Angstroms.

After the barrier layer 147b is formed in the inductor line 120c, the seed layer 148b is formed over the barrier layer 147b. The seed layer 148b optimizes the formation of the inductor line 120c. The formation of the seed layer 148b is commonly done using standard electroplating techniques, deposition techniques, or the like. The seed layer 148b is preferably copper (Cu). The seed layer 148b is preferably deposited to a thickness in a range between about 50 Angstroms and about 1000 Angstroms, and more preferably between about 200 Angstroms and about 500 Angstroms, and most preferably about 300 Angstroms. Those skilled in the art will appreciate that as the seed layer 148a is formed, other seed layers (not shown) are simultaneously formed in trenches for additional metallization lines and additional features in the oxide layer 122.

Figure 6A:
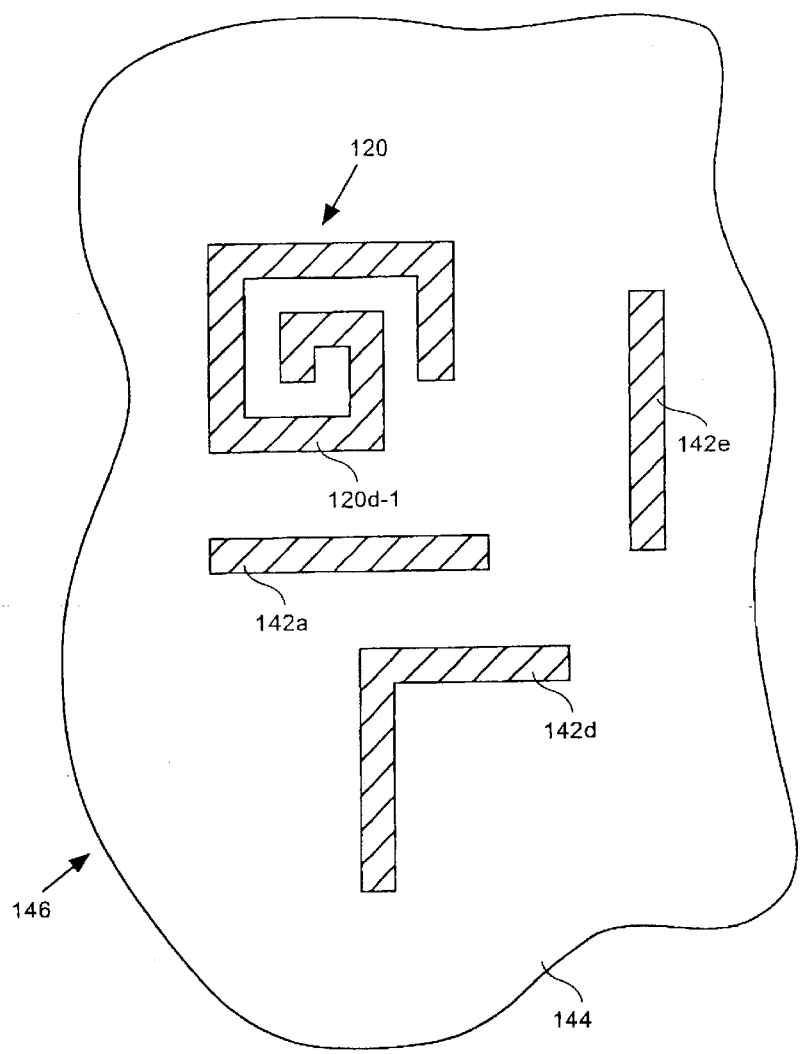
FIG. 6A is a top view of a semiconductor structure showing an inductor and metallization lines in accordance with one embodiment of the present invention.

FIG. 6A is a top view of the semiconductor structure 146 showing the inductor 120 and metallization lines 142a, 142d and 142e in accordance with one embodiment of the present invention. As the metallization lines 142a, 142d and 142e are formed in the semiconductor structure 146 using a damascene process, the inductor line 120d-1 of the inductor 120 is also formed using the same damascene process. As such, the inductor 120 is formed in the semiconductor structure 146 without additional fabrication steps. The inductor geometry of the inductor 120 is such that a charge is stored in the capacitance that is produced within the inductor 120 and the substrate as current flows through the inductor 120. It should be noted that the inductor 120 is formed in oxide layers that are not proximately located to the substrate 100 of the semiconductor structure 146. As is known to those skilled in the art, silicon in the substrate 100 affects the capacitance of the inductor 120 when the inductor 120 is placed within 50000 Angstroms of the substrate 100. Thus the inductor 120 is placed in the top most metal layers. The placement of the inductor 120 within the semiconductor structure 146 minimizes parasitic losses due to the inductor 120 being in close proximity to the substrate 100.

Figure 6B:
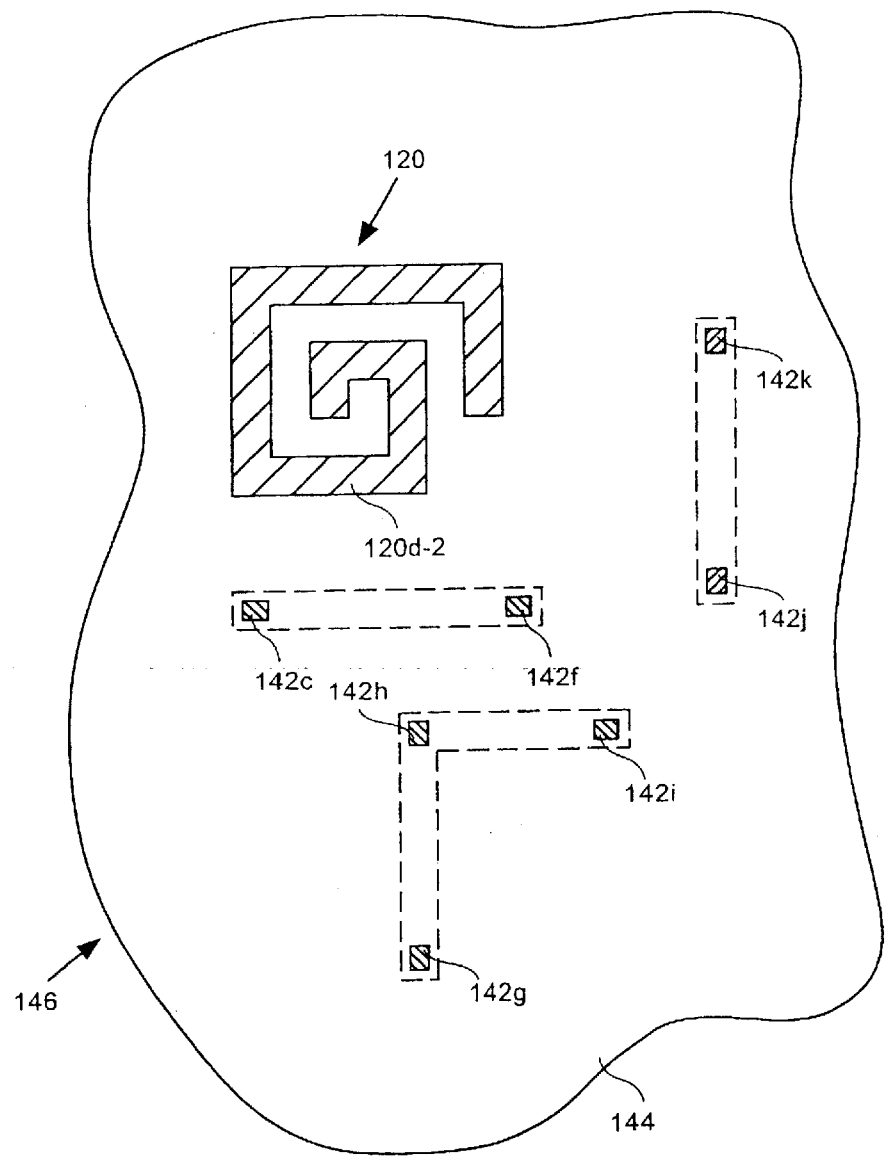
FIG. 6B is a top view of a semiconductor structure illustrating an inductor at a different depth within an oxide layer.

FIG. 6B is a top view of the semiconductor structure 146 illustrating the inductor 120 at a different depth within the oxide layer 144. FIG. 6B shows the conductive via 142c and conductive vias 142f-k in the oxide layer 144. As the vias 142c and 142f-k are formed during a dual damascene process, the inductor line 120d-2 of the inductor 120 is also formed. Thus, the thickness of the inductor 120 is maximized since metal is deposited to form the inductor 120 during a dual damascene process which forms the conductive vias 142c and 142f-k for interconnect metallization lines in the oxide layer 144.

Figure 7:
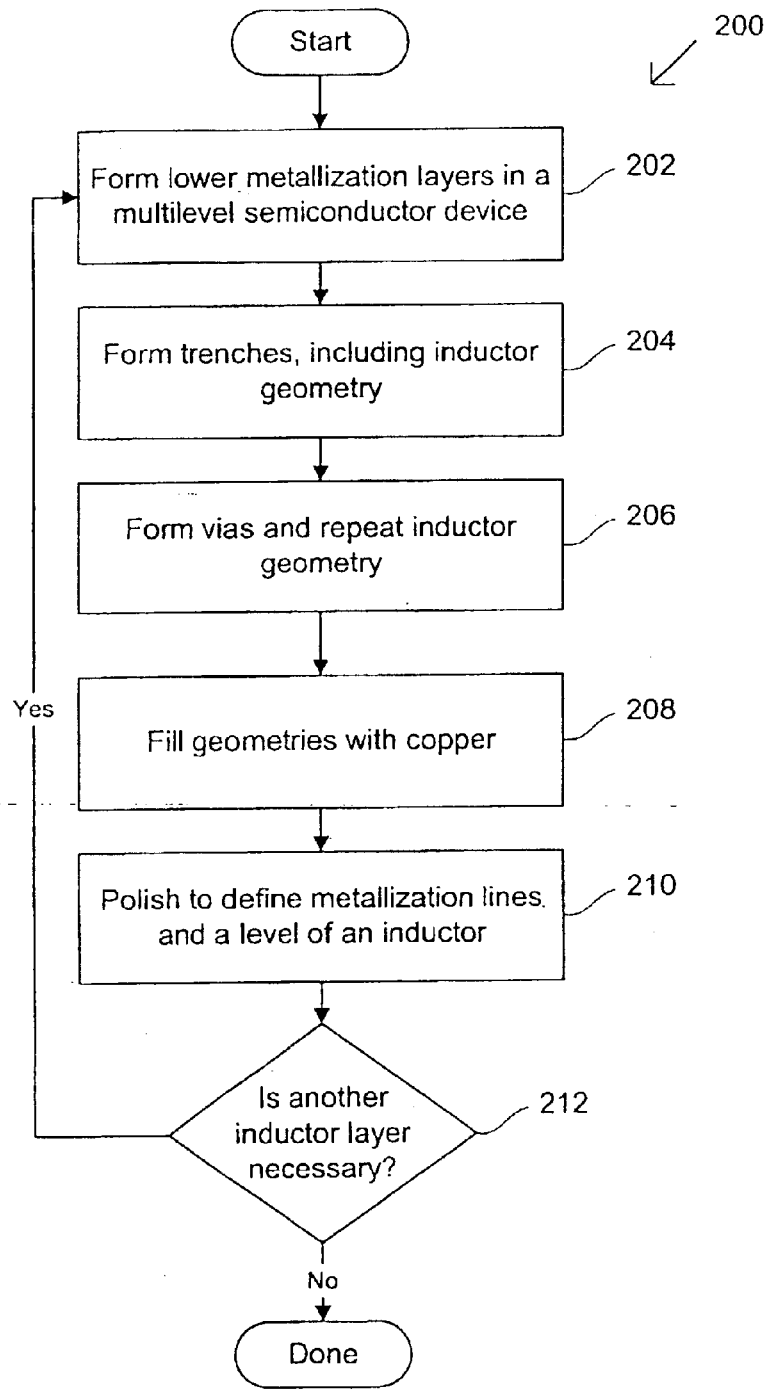
FIG. 7 is a flowchart showing a method for forming an inductor in a semiconductor structure in accordance with one embodiment of the present invention.

FIG. 7 is a flowchart showing a method 200 for forming an inductor in a semiconductor structure in accordance with one embodiment of the present invention. In operation 202, lower metallization layers are formed in a multilevel semiconductor device using the damascene and dual damascene processes previously described. Once the lower metallization layers are formed over a semiconductor substrate, a dielectric layer is blanket deposited over the lower metallization layers. After the dielectric layer is formed over the lower metallization layers, a photoresist layer is spin coated over the dielectric layer to pattern the dielectric layer.

The photoresist layer is patterned using standard photolithography techniques to form a patterned photoresist layer. The patterned photoresist layer is patterned to form windows that define metallization line trenches, a first inductor geometry trench and additional feature trenches in the dielectric layer. The window for the first inductor geometry trench defines an inductor geometry (i.e., spiral) for an inductor to be formed in the dielectric layer. The inductor geometry is configured such that a capacitance is created as current flows through inductor lines that will be formed in the first inductor geometry trench which define the inductor geometry. After the patterned photoresist layer is formed over the dielectric layer, the metallization line trenches, the first inductor geometry trench and the additional feature trenches are formed in operation 204 with an oxide etch operation.

A second photoresist layer is spin coated over the dielectric layer after the metallization line trenches, the first inductor geometry trench and the additional feature trenches are formed in the dielectric layer in operation 206. The second photoresist layer is patterned using standard photolithography techniques to form windows that define via trenches and a second inductor geometry trench having the same inductor geometry as the first inductor trench. Once the patterned photoresist layer is formed, an oxide etch operation is performed to form the via trench and the second geometry inductor trench in the dielectric layer in operation 206. After the operation 206 is complete, the method 200 proceeds to operation 208.

In operation 208, metallization lines, additional features, conductive vias and an inductor are formed in the dielectric layer by filling the metallization line trenches, the first inductor geometry trench, the additional feature trenches, the via trenches and the second inductor geometry trench with copper. Those skilled in the art will appreciate that the operations used to form the metallization lines, the additional features, the conductive vias and the inductor in the dielectric layer may be performed using a damascene and a dual damascene process as previously described. It should be noted that the inductor has an increased thickness because the inductor is formed during both the damascene process and the dual damascene operation. Consequently, the resistance of the inductor is decreased and the quality factor of the inductor is increased due to the increased metal thickness of the inductor. As such, the overall efficiency of the inductor is increased.

Once the operation 208 is complete, the method 200 moves to operation 210. In operation 210, the dielectric layer is polished to define the metallization lines and a level of the inductor in the semiconductor structure. The polish may be done using any technique well known in the art, including a CMP operation. The polishing operation makes the metallization lines and the level of the inductor even with a top surface of the dielectric layer.

In operation 212, it is determined if another inductor layer is necessary in the semiconductor structure after the operation 210 is complete. If another inductor layer is necessary in the semiconductor structure, the method 200 is repeated to form additional inductor layers. If another inductor layer is not needed, the method 200 is complete.

The use of a damascene and a dual damascene process to form the inductor 120 with copper allows a high quality factor of about less than 10 and more preferably of about less than 15 for the inductor 120. The use of a damascene process allows designers to increase the thickness of the metal within the inductor, thereby decreasing the overall resistance within the inductor 120.

The present invention now allows designers to increase the performance of inductors formed in semiconductor structures while decreasing parasitic losses and avoiding additional fabrication steps. The inductor of the present invention is much more efficient as evidenced by its high quality factor. The resistance of the inductor of the present invention is much lower than prior art inductors because of the use of copper in the inductor and by using copper in the complete inter-metal oxide thickness in the area of the inductor metal.

As previously mentioned, prior art inductors used aluminum, which has a higher resistance than copper, to form the inductor geometry of an inductor. Therefore, the current invention has much a lower resistance through the use of copper in the inductor. In addition, the thickness of the metal used in the inductor is maximized since the copper is deposited during both the damascene process to form metallization lines in an oxide layer and the dual damascene process to form conductive vias in the oxide layer.

The fabrication of the inductor of the present invention during the damascene process to form metallization lines and other features in a semiconductor structure also decreases fabrication costs and time to form the inductor. Thus, the benefits of a high quality factor and a low resistance coupled with the decreased fabrication costs and time makes this an attractive option to designers wishing to incorporate passive elements into a semiconductor structure.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An inductor structure, comprising:
   a first oxide layer having a first thickness;
   a first metallization level disposed in a first part of the first oxide layer, the first metallization level having an inductor geometry; and
   a second metallization level disposed in a second part of the first oxide layer, the second metallization level having the inductor geometry and being disposed over the first metallization level, the first part of the first oxide layer and the second part of the first oxide layer defining the first thickness of the first oxide layer.

2. An inductor structure as recited in claim 1, further comprising:
   a second oxide layer having a second thickness, the second oxide layer being disposed over the first oxide layer;
   a third metallization level disposed in a first part of the second oxide layer, the third metallization level having the inductor geometry; and
   a fourth metallization level disposed in a second part of the second oxide layer, the fourth metallization level having the inductor geometry and being disposed over the third metallization level, the first part of the second oxide layer and the second part of the second oxide layer defining the second thickness of the second oxide layer;
   whereby the inductor structure of the first metallization level, the second metallization level, the third metallization level and the fourth metallization level define a multi-level inductor structure having a low resistance characteristic.

3. An inductor structure as recited in claim 2, wherein the multi-level inductor structure has a high quality factor.

4. A semiconductor inductor, comprising:
   a first inductor structure being of a copper material and having an inductor geometry defined to a partial depth of an oxide layer disposed over a substrate;
   a metallization line being of the copper material defined in the oxide layer to the same partial depth of the oxide layer,
   a conductive via being of the copper material defined in a remaining depth of the oxide layer relative to the partial depth such that the conductive via interconnects the metallization line to another feature; and a second inductor structure being of the copper material and having the inductor geometry such that the second inductor structure is disposed in the remaining depth of the oxide layer.

5. A semiconductor inductor as recited in claim 4, wherein the semiconductor inductor has a high quality factor.

* * * * *